United States Patent
Delay

(10) Patent No.: US 8,525,043 B2
(45) Date of Patent: Sep. 3, 2013

(54) PRINTED SUBSTRATE THROUGH WHICH VERY STRONG CURRENTS CAN PASS AND CORRESPONDING PRODUCTION METHOD

(75) Inventor: Christian Delay, Montbazon (FR)

(73) Assignee: AEG Power Solutions B.V., Dutch Company, Zwanenburg (NL)

( * ) Notice: Subject to any disclaimer, the term of this patent is extended or adjusted under 35 U.S.C. 154(b) by 542 days.

(21) Appl. No.: 12/513,775

(22) PCT Filed: Nov. 13, 2007

(86) PCT No.: PCT/FR2007/052326
§ 371 (c)(1),
(2), (4) Date: May 26, 2009

(87) PCT Pub. No.: WO2008/059162
PCT Pub. Date: May 22, 2008

(65) Prior Publication Data
US 2010/0025090 A1 Feb. 4, 2010

(30) Foreign Application Priority Data
Nov. 14, 2006 (FR) ................................. 06 54887

(51) Int. Cl.
*H05K 1/11* (2006.01)
*H05K 7/00* (2006.01)

(52) U.S. Cl.
USPC .......................................... 174/261; 361/779

(58) Field of Classification Search
USPC ........ 361/779, 777, 794, 775, 807; 174/16.2, 174/71 B, 257, 261, 263, 126.1, 250; 228/180.21; 439/514, 876
See application file for complete search history.

(56) References Cited

U.S. PATENT DOCUMENTS

| | | | | |
|---|---|---|---|---|
| 4,772,496 A * | 9/1988 | Maeda et al. | ................. | 428/35.9 |
| 4,967,042 A * | 10/1990 | Shepherd et al. | .............. | 174/250 |
| 4,985,601 A * | 1/1991 | Hagner | .......................... | 174/261 |
| 6,062,903 A * | 5/2000 | Hawes et al. | ................. | 174/261 |
| 6,294,739 B1 * | 9/2001 | Becker | ......................... | 174/126.1 |
| 2004/0245242 A1 * | 12/2004 | Byrne et al. | ................... | 219/517 |

FOREIGN PATENT DOCUMENTS

| | | |
|---|---|---|
| DE | 44 25 803 A1 | 2/1995 |
| JP | 9-153664 A | 6/1997 |
| JP | 09153664 A * | 6/1997 |
| JP | 10-200221 A | 7/1998 |
| JP | 10200221 A * | 7/1998 |

OTHER PUBLICATIONS

JP 10200221 A Machine Translation included, Jul. 1998.*
JP 09153664 A Machine Translation included, Jun. 1997.*
Definition of "solder" by www.dictionary.com Jan. 23, 2013.*

* cited by examiner

*Primary Examiner* — Timothy Thompson
*Assistant Examiner* — Roshn Varghese
(74) *Attorney, Agent, or Firm* — Sughrue Mion, PLLC

(57) ABSTRACT

On a printed circuit or substrate board (10) designed to receive electronic components and having conductive tracks (12) printed on said board, one or more conductive bars (18) are provided that are mounted one after another between conductive link surfaces (140, 142, 144), the conductive bars (18) being electrically interconnected during a subsequent soldering process that is either a wave soldering process or a soldering process in a reflow oven.

12 Claims, 3 Drawing Sheets

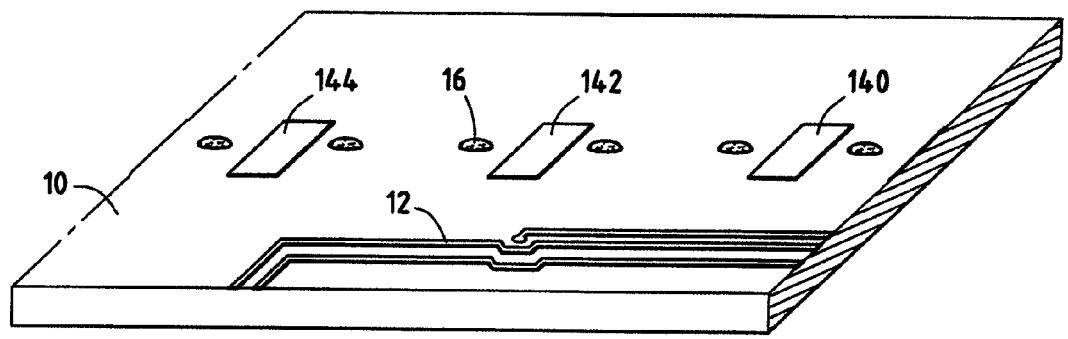
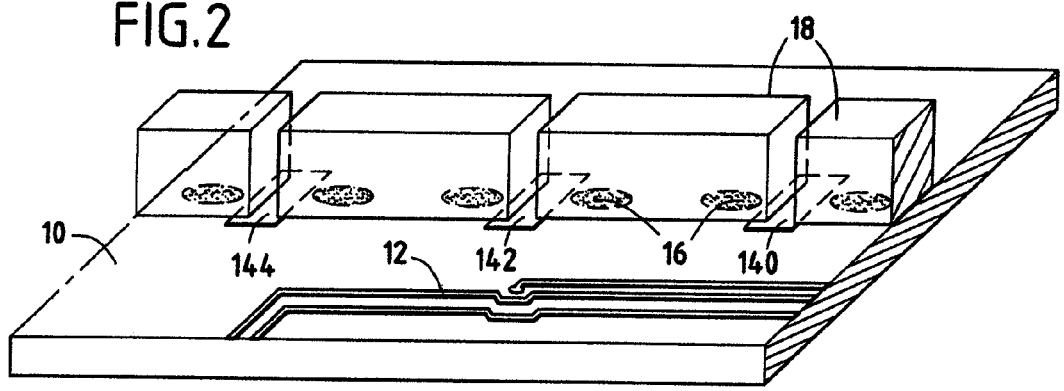
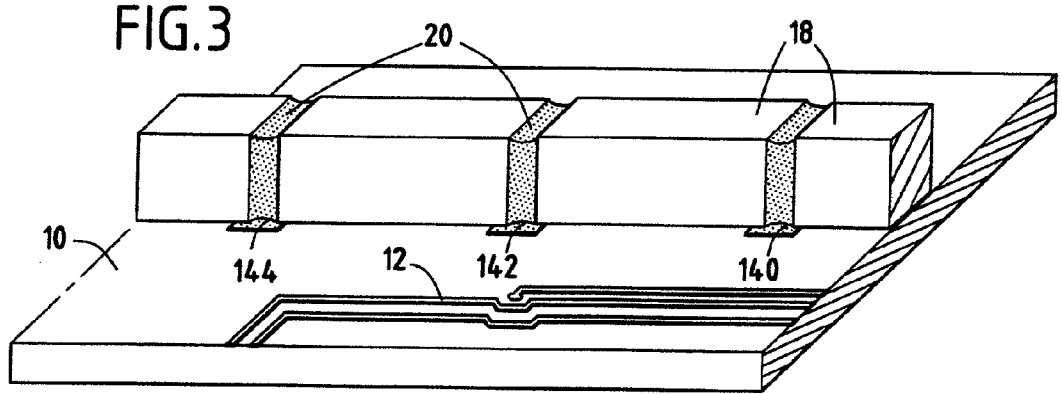

PRINTED SUBSTRATE THROUGH WHICH VERY STRONG CURRENTS CAN PASS AND CORRESPONDING PRODUCTION METHOD

This application is a 371 National Phase of PCT/FR2007/052326 filed Nov. 13, 2007, claiming the priority of French Patent Application 0654887 filed Nov. 14, 2006, the disclosures of which are hereby incorporated by reference.

FIELD OF THE INVENTION

The present invention relates to the field of mounting power components on a printed circuit or substrate, and it relates more particularly to an architecture making it possible to pass high-power currents, of the order of 500 amps (A) or more.

PRIOR ART

Nowadays, when it is desired to pass high currents on a printed circuit or substrate, it is known that the size of the conductive tracks can be increased. If the width of the tracks is increased, e.g. to 40 millimeters (mm) instead of the standard 3 mm, it is particularly expensive because most of the surface of the printed circuit or substrate is then used for the tracks only. Thus, it is often preferable to increase the thickness of the tracks instead. Thus, whereas standard technology using a thickness of copper of 35 micrometers (μm) allows maximum currents of 10 A to pass for a track width of 3 mm, by using a thickness of 140 μm, it is possible to reach currents of 25 A with track widths of 3 mm, and to reach currents of 100 A with track widths of 25 mm.

It is also known that using a thickness of copper of 210 μm associated with laminated multi-layer technology makes it possible to reach currents of 250 A, but the cost of achieving that is considerable.

Another technique for passing high currents is to use a fully wired solution. However, that solution is also very costly and subject to frequent wiring errors. In addition, it is ill-adapted to pluggable modules.

OBJECT AND DEFINITION OF THE INVENTION

An object of the invention is thus to mitigate the above-mentioned drawbacks by proposing a novel printed circuit architecture that makes it possible to pass very high currents for equivalent printed circuit structure. An object of the invention is also to implement this architecture using conventional printed circuit or substrate assembly methods.

These objects are achieved by a printed substrate designed to receive electronic components and having conductive tracks printed on said substrate, said printed substrate being characterized in that it further has a plurality of conductive link surfaces that are spaced apart regularly and that are designed to interconnect a plurality of conductive bars electrically during a subsequent soldering process, the bars being mounted one after another, and portions of adjacent conductive bars that are electrically interconnected lying on a common conductive link surface.

Thus, instead of passing through a single conductive power track, high currents now pass through a sort of power "rail", thereby making it possible to pass currents of level limited only by the section of the conductive bars forming the rail.

Said portions of the conductive bars that are electrically interconnected during said soldering process are the ends of or the longitudinal edges of said conductive bars.

Preferably, said conductive bars are held on the substrate by spots of adhesive.

Advantageously, said soldering process is the process consisting in soldering said electronic components on said printed substrate.

Preferably, said conductive bars are metal bars, preferably made of copper or of aluminum, and they may advantageously be covered with protection made of a nickel alloy. Each of said conductive bars has a section determined by the level of current that is to be passed.

Said conductive link surfaces may be connected together to form a continuous conductive surface. Said continuous conductive surface then advantageously includes resist zones for receiving said spots of adhesive on them. In this configuration, the conductive surface may optionally also conduct a fraction of the current, but any contribution it makes to such conduction remains small compared with the contribution from the conductive bars.

In another embodiment that is particularly adapted to soldering in a reflow oven, the dimensions of said conductive link surfaces are adapted so that, on being heated in a reflow oven, solder paste deposited on an optionally offset zone of a conductive link surface comes to fill exactly the gap between the two adjacent conductive bars lying on said conductive link surface.

The invention also provides a method of producing a printed substrate making it possible to pass very high currents on at least one conductive surface of said substrate, said method being characterized in that said conductive surface is made up of a plurality of conductive link surfaces that are spaced apart regularly and that are designed to interconnect a plurality of conductive bars electrically during a subsequent soldering process, the bars being mounted one after another, and portions of adjacent conductive bars that are electrically interconnected lying on a common conductive link surface. Preferably said conductive link surfaces are surfaces made of copper or of nickel.

In the implementation considered, said soldering process consists in soldering electronic components onto said printed substrate by means of wave soldering or in a reflow oven.

BRIEF DESCRIPTION OF THE DRAWINGS

The characteristics and advantages of the present invention appear more clearly from the following description given by way of non-limiting indication and with reference to the accompanying drawings, in which:

FIGS. 1 to 3 show three successive steps in fabricating a printed circuit or substrate board in a first implementation of the invention;

DETAILED DESCRIPTION OF PREFERRED EMBODIMENTS

Figure 8:
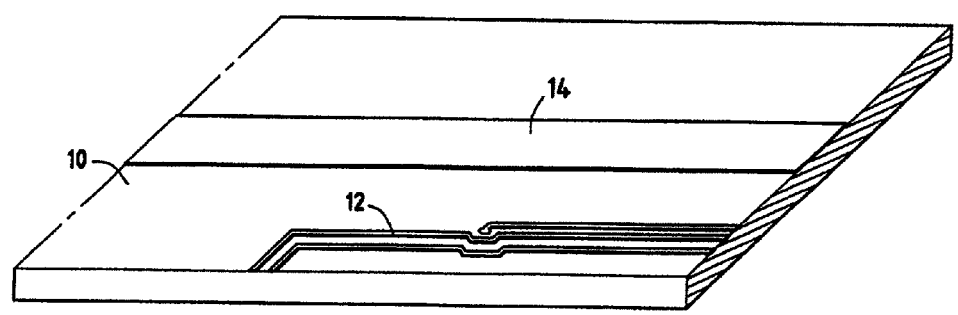
FIG. 8 shows a prior art printed circuit board.

FIG. 8 shows a detail of a conventional architecture for a printed substrate such as a printed circuit board, including conductors or conductive tracks 12 and a power track 14 that are mounted on a top face of an insulating circuit board or substrate 10. In a standard configuration, the thickness of the copper layer forming the tracks is 35 μm and the width of the power track is 3 mm, for example.

As is well known, the various tracks serve to interconnect various electronic components (not shown) that are mounted on the printed substrate, electrical contact being provided by hot fastening means (not shown) either deposited on "solder" spots on being heated in a reflow oven or else deposited on all of the accessible conductive zones during a wave soldering process.

Without modifying the present-day process for assembling and soldering electronic cards, the invention proposes a printed substrate that, for a given thickness of copper, makes it possible to pass currents that it is not possible at present to pass with such a thickness of copper. In particular, a printed substrate structure is proposed that is produced in a conventional process by wave soldering or in a reflow oven and that, with a standard thickness of copper of 35 µm and a power track width of 3 mm, makes it possible to pass currents of 500 A and higher.

For this purpose, in accordance with the invention and as illustrated by the first implementation shown in FIGS. 1 to 3, and that is applicable more particularly to a wave soldering process, the power track is replaced with a plurality of conductive link surfaces 140, 142, 144 that are advantageously made of copper, although it is possible for them to be made of nickel, and that are spaced apart regularly. Between the link surfaces, spots of adhesive 16 are deposited for fastening a plurality of conductive bars 18 to the substrate, the facing ends of any two adjacent conductive bars resting on a common link surface. Said conductive bars are preferably made of metal, e.g. made of copper or of aluminum that can advantageously be covered with protection made of a nickel alloy, such as nickel sulfamate or a nickel-silver alloy. Each of said conductive bars can have a length of 10 mm (without that length being limiting), a height lying, for example, in the range 1 mm to 5 mm (depending on the level of current to pass), and a width that can vary, e.g. of 3 mm, of the same order of magnitude as the width of the copper link surfaces between which said bars are fastened. FIG. 2 shows an example of bar placement in which the bars are placed one after another with gaps between their ends that have a width of about 0.4 mm, which width is less than the width of the link surface but that is sufficiently large to form a solder bridge 20 during the wave soldering process, thereby providing a conductive joint between two adjacent bars (FIG. 3). This soldering is preferably performed with the wave that solders all of the other components mounted on the printed substrate. But it is also possible for soldering to be performed by a first wave that is distinct from the wave that fastens the components.

At the end of this soldering process, instead of a power track being obtained, a power "rail" is obtained that then makes it possible to pass very high currents, e.g. 100 A with bars of dimensions 10 mm×5 mm×3 mm, the current no longer passing directly via the power track but rather through the conductive bars interconnected by the solder joints and whose section then determines the allowable current magnitude.

It can be noted that, when the rail forms a right angle (configuration not shown), the contact between adjacent conductive bars disposed one after another is no longer established via their ends, but rather, for example, between one end of the first bar and a longitudinal edge of the second bar.

FIGS. 4 to 7 show the second implementation of the invention that applies more particularly to the soldering process that takes place in a reflow oven.

Figure 4:
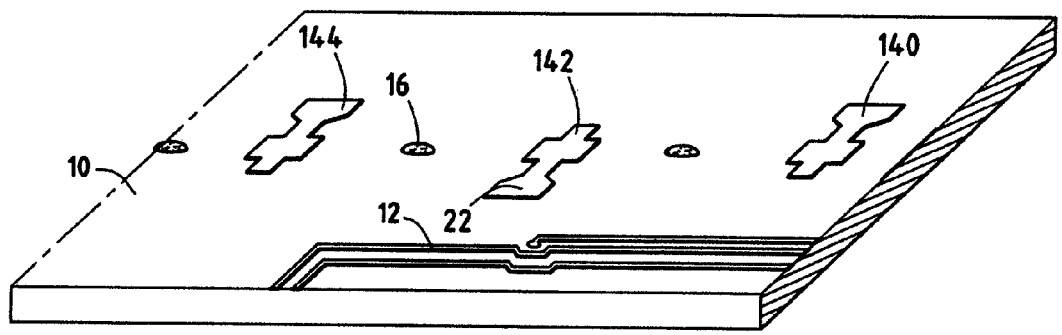
FIGS. 4 to 7 show four successive steps in fabricating a printed circuit or substrate board in a second implementation of the invention.
Figure 5:
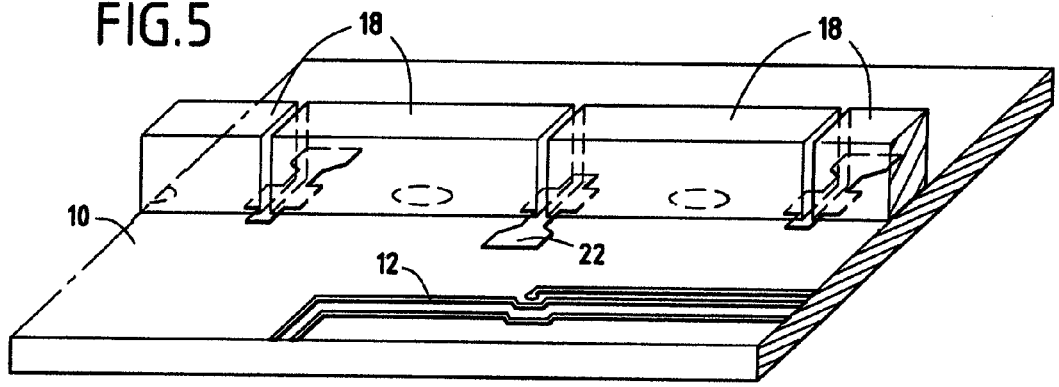
Figure 6:
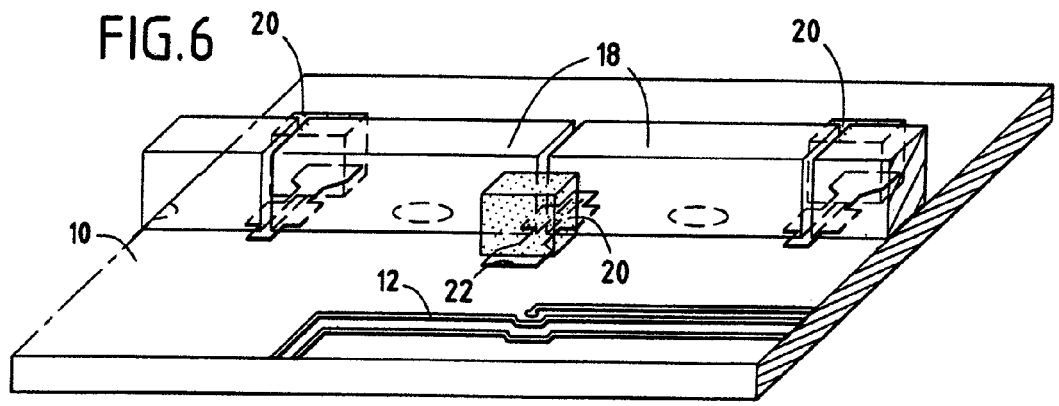
Figure 7:
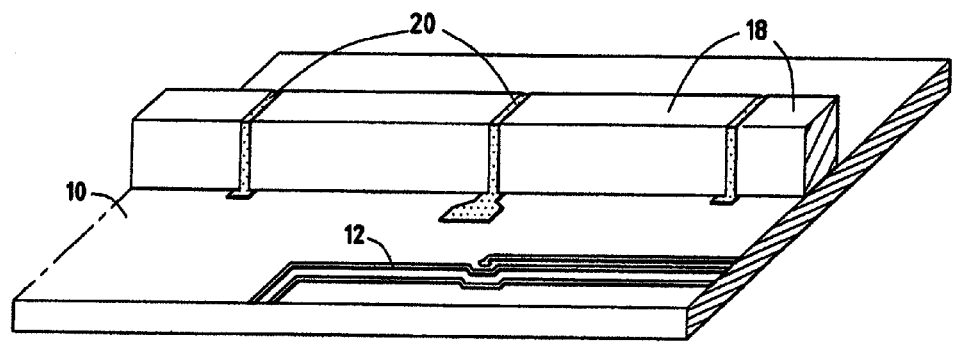

FIG. 4 shows the printed substrate with its conductive tracks 12 and its conductive link surfaces 140, 142, 144 marked on the surface of the substrate board 10. As above, said conductive link surfaces made of copper or of nickel are spaced apart substantially by the length of a conductive bar. However, in this second embodiment, each of the surfaces can have an offset zone 22 designed to receive a block of solder paste (see FIG. 6). As shown by the example of FIG. 4, the dimensions and the particular cross-shape of each conductive link surface are adapted so that on being heated in the oven, the solder paste 20 deposited on the offset zone 22 comes to fill exactly the gap between two adjacent conductive bars (FIG. 7).

As in the preceding embodiment, each substrate zone situated between each conductive link surface has one or more spots of adhesive 16 so that the conductive bars disposed one after another adhere sufficiently to the substrate during the subsequent soldering process.

With the invention, since the current no longer passes via the power track (and thus does not suffer from any "bottleneck" on passing through that track), but rather passes through the conductive bars via the solder joints, it becomes possible pass very high currents, of up to 500 A, or higher, for a particularly low cost since neither the soldering process nor the design of the printed substrate are modified, the substrate remaining a standard circuit with copper tracks having a thickness of 35 µm, including the link surfaces.

It can be noted that, although in the examples shown, the power rail is rectilinear with bars placed one after another, naturally the power rail can adopt an entirely different configuration, in the manner of dominos, with one rail being turned through 90° relative to or lying across the end of another rail, the electrical connection established during the soldering process then going via portions of bar resting on a common conductive link surface. Naturally, at least two of the bars making up the rail have respective integrated connectors (terminals) for a direct external link (i.e. without going via a track of the substrate), the connector of each bar being disposed at one of its ends.

Although, in the examples shown, the link surfaces are independent from one another, it is quite possible to interconnect them. In which case, it is advantageous to provide the resulting continuous conductive surface with resist zones for the purpose of depositing the spots of adhesive on them. This configuration guarantees additional conduction of current that is, however, low, and that is totally incomparable with the current conduction through the conductive bars.

The invention is particularly adapted to designing printed circuit cards for very high power components, rectifiers, or equivalent devices.

The invention claimed is:

1. A printed substrate designed to receive electronic components and having conductive tracks (12) printed on said substrate (10), said printed substrate comprising:
   a plurality of conductive link surfaces (140, 142, 144) printed directly on said substrate with spacing therebetween;
   a plurality of conductive bars (18) respectively electrically interconnecting adjacent conductive link surfaces, the bars being mounted one after another and respectively extending across the spacing, adjacent conductive bars having a gap therebetween; and
   solder portions filling each said gap and respectively interconnecting portions of adjacent bars, the portions lying on a common conductive link surface,
   wherein the conductive bars and the solder portions together form a continuous conductive rail; and
   wherein said conductive bars are held on the substrate by spots of adhesive.

2. A printed substrate according to claim 1, wherein said portions of the conductive bars that are electrically interconnected by said soldering portions are the ends of or the longitudinal edges of said conductive bars.

3. A printed substrate according to claim 1, wherein said conductive bars (18) are metal bars.

4. A printed substrate according to claim 1, wherein said conductive bars (18) are covered with protection made of a nickel alloy.

5. A printed substrate according to claim 1, wherein each of said conductive bars (18) has a section determined by the level of current that is to be passed.

6. A printed substrate according to claim 1, wherein the dimensions of said conductive link surfaces are adapted so that, on being heated in a reflow oven, solder paste deposited on a zone (22) of a conductive link surface comes to fill exactly the gap between the two adjacent conductive bars (18) lying on said conductive link surface.

7. A printed substrate according to claim 6, wherein said zone is offset.

8. A printed substrate according to claim 1, wherein said continuous conductive rail includes resist zones for depositing said spots of adhesive on them.

9. A method of producing a printed substrate making it possible to pass very high currents on a conductive surface of said substrate (10), said method comprising the following steps:

printing a plurality of conductive link surfaces (140, 142, 144) that are spaced apart directly on the substrate;

providing a plurality of conductive bars (18) that respectively extend across the space between the conductive link surfaces to electrically interconnect the conductive link surfaces, the bars being mounted one after another, and adjacent conductive bars having a gap therebetween;

adhering the conductive bars to the substrate using spots of adhesive;

providing solder portions in each gap to electrically interconnect adjacent portions of conductive bars, the portions of adjacent conductive bars that are electrically interconnected lying on a common conductive link surface, wherein the conductive bars and the solder portions together form a continuous conductive rail.

10. A method of producing a printed substrate according to claim 9, wherein said conductive link surfaces are surfaces made of copper or of nickel.

11. A method of producing a printed substrate according to claim 9, wherein said soldering step includes soldering electronic components onto said printed substrate by wave soldering.

12. A method of producing a printed substrate according to claim 9, wherein said soldering step includes soldering electronic components onto said printed substrate in a reflow oven.

* * * * *